US009620457B2

(12) United States Patent
Wachter et al.

(10) Patent No.: US 9,620,457 B2
(45) Date of Patent: Apr. 11, 2017

(54) SEMICONDUCTOR DEVICE PACKAGING (71) Applicant: Infineon Technologies AG, Neubiberg (DE)

(72) Inventors: Ulrich Wachter, Regensburg (DE); Eva Wagner, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 14/090,570

(22) Filed: Nov. 26, 2013

(65) Prior Publication Data
US 2015/0145149 A1    May 28, 2015

(51) Int. Cl.
*H01L 23/544* (2006.01)
*H01L 21/78* (2006.01)
*H01L 23/31* (2006.01)
*H01L 21/56* (2006.01)
*H01L 23/00* (2006.01)
(Continued)

(52) U.S. Cl.
CPC ......... *H01L 23/544* (2013.01); *B23K 26/364* (2015.10); *B23K 26/40* (2013.01); *B23K 26/402* (2013.01); *H01L 21/561* (2013.01); *H01L 21/78* (2013.01); *H01L 23/3114* (2013.01); *H01L 24/19* (2013.01); *H01L 24/96* (2013.01); *H01L 24/97* (2013.01); *B23K 2203/08* (2013.01); *B23K 2203/10* (2013.01); *B23K 2203/12* (2013.01); *B23K 2203/14* (2013.01); *B23K 2203/172* (2015.10); *B23K 2203/26* (2015.10); *B23K 2203/30* (2015.10); *H01L 21/568* (2013.01); *H01L 2223/54433* (2013.01); *H01L 2224/12105* (2013.01); *H01L 2924/12042* (2013.01);
(Continued)

(58) Field of Classification Search
CPC ....... H01L 23/544; H01L 24/96; H01L 24/19; H01L 21/561; H01L 23/3114; H01L 21/78
See application file for complete search history.

(56) References Cited

U.S. PATENT DOCUMENTS 6,469,258 B1 * 10/2002 Lee .......... H01L 23/60
174/260
7,745,910 B1 * 6/2010 Olson .......... H01L 21/561
257/659
(Continued)

FOREIGN PATENT DOCUMENTS

CN        103021892 A       4/2013

OTHER PUBLICATIONS

Author Unknown. "Low-k Grooving." DISCO Technologies, 2013. Also available at http://www.disco.co.jp/eg/solution/library/low_k.html.

*Primary Examiner* — David Vu
(74) *Attorney, Agent, or Firm* — Murphy, Bilak & Homiller, PLLC (57) ABSTRACT

A method of manufacturing a semiconductor device package includes encapsulating at least partially a plurality of semiconductor chips with encapsulating material to form an encapsulation body. The encapsulation body has a first main surface and a second main surface. At least one of a metal layer and an organic layer is formed over the first main surface of the encapsulation body. At least one trace of the at least one of the metal layer and the organic layer is removed by laser ablation. The encapsulation body is then separated into a plurality of semiconductor device packages along the at least one trace.

14 Claims, 7 Drawing Sheets (51) Int. Cl.
*B23K 26/40* (2014.01)
*B23K 26/402* (2014.01)
*B23K 26/364* (2014.01)
B23K 103/08 (2006.01)
B23K 103/16 (2006.01)
B23K 103/00 (2006.01)
B23K 103/10 (2006.01)
B23K 103/12 (2006.01)
B23K 103/14 (2006.01)
B23K 103/18 (2006.01)

(52) U.S. Cl.
CPC ............... *H01L 2924/13055* (2013.01); *H01L 2924/13091* (2013.01)

(56) References Cited

U.S. PATENT DOCUMENTS

| | | | |
|---|---|---|---|
| 8,022,511 B2* | 9/2011 | Chiu | H01L 21/568 257/659 |
| 2011/0115059 A1* | 5/2011 | Lee | H01L 21/561 257/659 |
| 2012/0077315 A1 | 3/2012 | Fukumitsu et al. | |
| 2014/0001514 A1 | 1/2014 | Schulze et al. | |
| 2014/0159251 A1* | 6/2014 | Marimuthu | H01L 24/19 257/774 |

* cited by examiner

SEMICONDUCTOR DEVICE PACKAGING

TECHNICAL FIELD

This invention relates generally to the technique of semiconductor device packaging, and in particular to the technique of dividing an encapsulation body into a plurality of semiconductor device packages.

BACKGROUND

Semiconductor device manufacturers are constantly striving to increase the performance of their products, while decreasing their cost of manufacture. A cost intensive area in the manufacture of semiconductor device packages is packaging the semiconductor chip. Semiconductor device packages and methods of manufacturing the same at low expenses and high yield are desirable.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a material layer formed or located "over" a surface may be used herein to mean that the material layer be located (e.g. formed, deposited, etc.) "directly on", e.g. in direct contact with, the implied surface. The word "over" used with regard to a material layer formed or located "over" a surface may be used herein to mean that the material layer be located (e.g. formed, deposited, etc.) "indirectly on" the implied surface with one or more additional layers being arranged between the implied surface and the material layer.

The semiconductor device packages described herein may contain one or more semiconductor chips. The semiconductor packages described further below may contain semiconductor chip(s) of different types, may be manufactured by different technologies and may include, for example, integrated circuits, e.g., monolithic integrated electrical, electro-optical, electro-mechanical circuits, organic substrate, inorganic substrate, miniaturized electronic packages and/or passives. More specifically, the semiconductor chip(s) may include logic integrated circuits, analogue integrated circuits, mixed signal integrated circuits, power integrated circuits, memory circuits, or integrated passive devices (IPD).

The semiconductor chip(s) described herein may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors.

The semiconductor chip(s) described herein may include control circuits, microprocessors, memory circuits and/or micro-electromechanical components. They may e.g. include sensors or detectors (such as, e.g., an antenna, a mechanical force sensor, a pressure sensor, a microphone, an optical sensor/detector) and/or power devices (e.g. power switches, voltage converters, etc.). In particular, the semiconductor chip(s) described herein may comprise wireless communication components such as, e.g., RF (radio frequency) circuitry, near field communication (NFC) circuitry and/or contactless or coreless coupling circuitry, etc.

Devices containing semiconductor chip(s) having a horizontal structure may be involved. A semiconductor chip having a horizontal structure has chip electrodes only on one of its two main surfaces, e.g. on its active surface.

Devices containing semiconductor chip(s) having a vertical structure may be involved. In a semiconductor chip having a vertical structure, the electric currents (e.g. the load current) can flow in a direction perpendicular to the main surfaces of the semiconductor chip. A semiconductor chip having a vertical structure has electrodes on its two main surfaces, that is to say on its top side and bottom side. In particular, power semiconductor chip(s) such as, e.g., power MOSFETs (Metal Oxide Semiconductor Field Effect Transistors), IGBTs (Insulated Gate Bipolar Transistors), JFETs (Junction Gate Field Effect Transistors), power bipolar transistors or power diodes may have a vertical structure. By way of example, the source electrode and gate electrode of a power chip, e.g. a power MOSFET chip, may be situated on one main surface, while the drain electrode of the power chip is arranged on the other main surface.

The semiconductor chip(s) may have chip electrodes (or contact pads) which allow electrical contact to be made with the integrated circuits included in the semiconductor chip(s). The chip electrodes, e.g. I/O electrodes, ground electrodes, power supply electrodes, load electrodes, control electrodes, etc., may include one or more electrode metal layers that are applied to the semiconductor material.

The semiconductor device package described herein may comprise an encapsulating material forming an encapsulant which embeds the semiconductor chip(s). The encapsulating material may be an electrically insulating material and may comprise or be a thermoset material or a thermoplastic material. A thermoset material may, e.g., be made on the basis of an epoxy resin, a silicone resin or an aryclic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may comprise or be a polymer material, e.g. a duroplastic polymer material. The encapsulating material may comprise or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

The encapsulating material may be applied over the semiconductor chips by embedding the semiconductor chips into the encapsulating material by, e.g., molding or laminating.

In the first case, if the encapsulating material is made of a mold material, various techniques such as, e.g., compression molding, injection molding, powder molding, or liquid molding may be used to form the encapsulation body of the layer stack and thus the encapsulant of the semiconductor device packages. The mold material may be applied to overmold the semiconductor chips and a temporary carrier on which the semiconductor chips are placed.

In the second case, if the encapsulating material is made of a laminate material, the encapsulating material may have the shape of a piece of a layer, e.g. a piece of a sheet or foil that is laminated over the semiconductor chips and over a carrier on which the semiconductor chips are placed. Heat and pressure may be applied for a time suitable to attach the piece of a foil or sheet to the underlying structure. During lamination, the electrically insulating foil or sheet is capable of flowing (i.e. is in a plastic state), resulting in that gaps between the semiconductor chips and/or other topological structures on the carrier are filled with the polymer material of the electrically insulating foil or sheet. The electrically insulating foil or sheet may comprise or be any appropriate thermoplastic or thermoset material. In various embodiments, the insulating foil or sheet may comprise or be a prepreg (short for pre-impregnated fibers), that is e.g. made of a combination of a fiber mat, for example glass or carbon fibers, and a resin, for example a thermoset or thermoplastic material. Prepreg materials are typically used to manufacture PCBs (printed circuit boards).

The encapsulation body may be at least partly covered by one or more metal layers. The metal layer may, e.g., be an electromagnetic interference shielding layer or an antenna layer. The metal layer may, e.g., cover a part or all of a first main surface of the encapsulation body and/or a part or all of a first main surface of the semiconductor chip. Any desired metal, for example, aluminum, titanium, gold, silver, copper, palladium, platinum, nickel, chromium, or nickel vanadium, or metal alloys thereof may be used as the material. The metal layer may be but need not be homogenous or manufactured from just one material, that is to say various compositions and concentrations of the materials contained in the metal layer are possible.

The metal layer may be applied over the encapsulation body by various techniques. By way of example, the metal layer may be deposited over or on the encapsulation body by a CVD (chemical vapor deposition) process, a PVD (physical vapor deposition) process, spraying, printing, a plasma beam process, galvanic or electroless deposition, or sputtering.

The encapsulation body may be at least partly covered by an organic layer. The organic layer may be a so-called backside protection layer. The organic layer may e.g. cover the metal layer. The organic layer may be applied by e.g. over-molding or lamination.

Further, the encapsulation body may be at least partly covered by an electrical redistribution structure. The electrical redistribution structure may, e.g., cover a part or all of a second main surface (e.g. front side) of the encapsulation body. The electrical redistribution structure may be electrically connected to the chip electrode (s). The electrical redistribution structure may include one or more metallization layers. The one or more metallization layers may serve as redistribution layers (RDLs).

Thus, in order to fabricate embedded device packages, a layer stack comprising the encapsulation body and additional layers such as, e.g., the metal layer and/or the organic and/or the RDLs is to be diced. While dicing (e.g. sawing) through homogeneous material may be optimized e.g. by controlling the dicing parameters (cutting speed, blade grain size, etc.), dicing through a number of layers of different material may be difficult. In particular, smearing of metal material may clog the cutting grains of the dicing blade and therefore may cause burrs or layer delamination, and chipping of silicon corners may occur due to a high sawing pressure needed. To avoid such difficulties, before separating the encapsulation body into a plurality of semiconductor device packages, the at least one trace of the at least one of a metal layer and/or an organic layer may be removed by laser ablation. That way, by e.g. eliminating one or more layers in the dicing street regions, the amount and/or diversity of different materials in the dicing street regions is reduced.

Figure 1:
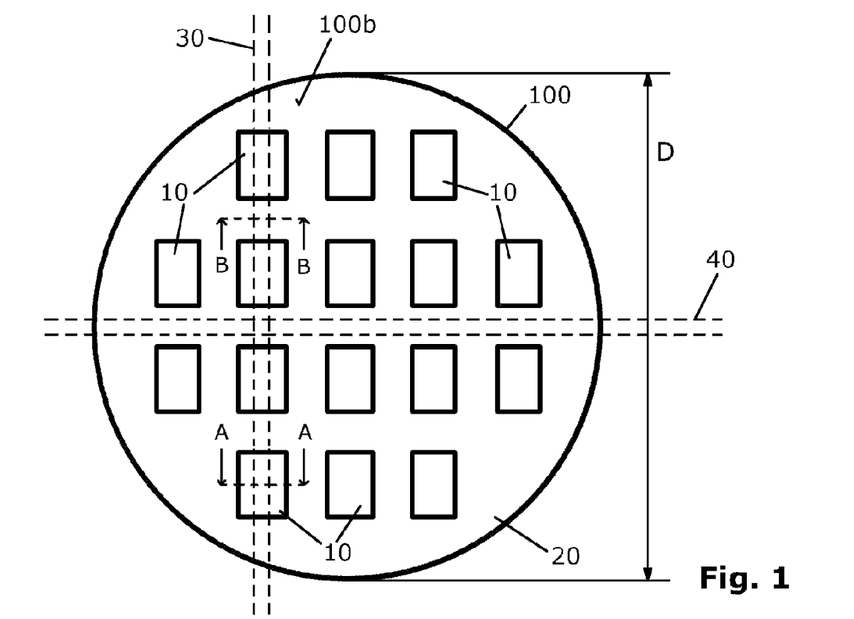
FIG. 1 schematically illustrates a plan view of an exemplary encapsulation body including a plurality of semiconductor chips.

FIG. 1 illustrates an exemplary embodiment of an encapsulation body 100. The encapsulation body 100 includes a plurality or array of semiconductor chips 10. The semiconductor chips 10 are at least partly embedded in the encapsulation body 100. The semiconductor chips 10 are distributed in a space-apart relationship across the encapsulation body 100. Byway of example, the encapsulation body 100 may have a sheet-like or plate-like form. The encapsulation body 100 may have a lateral dimension (e.g. diameter) D of equal to or greater than 100 mm, 200 mm or 300 mm. The encapsulation body 100 may have a disc-like or polygonal shape. By way of example, some tens or, e.g., more than fifty or hundred semiconductor chips 10 may be included in one encapsulation body 100.

By way of example, the encapsulation body 100 may be manufactured by molding or lamination. The encapsulation body 100 may be a so-called "artificial wafer" or "reconfigured wafer" as used in an embedded wafer level process (eWLP) for manufacturing embedded device packages such as, e.g., embedded wafer level ball grid array (eWLB) packages. More details will be given further below.

Semiconductor device packages, i.e. embedded device packages, are manufactured from the encapsulation body 100 by dividing the encapsulation body 100 into a plurality of semiconductor device packages. The singulation of semiconductor device packages is done by separating or dicing the encapsulation body along dicing streets 40, 30. Dicing streets 40, 30 are also referred to as kerf regions in the art.

As may be seen in FIG. 1, dicing streets 40 may run exclusively within the spacing between the semiconductor chips 10. These dicing streets 40, therefore, may only run through encapsulating material 20 of the encapsulation body 100 and materials or layers (not shown in FIG. 1) which are applied to the main surfaces of the encapsulation body 100. Dicing streets 40 do not run through semiconductor material of the semiconductor chips 10.

On the other hand, dicing streets 30 may run through the encapsulating material 20 of the encapsulation body 100 and through semiconductor chips 10. In other words, dicing streets 30 intersect and divide at least one of the semiconductor chips 10 included in the encapsulation body 100. Such dicing streets 30 run through the encapsulating material 20, through semiconductor material (of the semiconductor chips 10) and through materials (layers) which are applied to the main surfaces of the encapsulation body 100.

The term "dicing" or "dicing street" as used herein is not limited to a specific technique of diving or separating the encapsulation body 100. Dicing, in this text, generally means separating or dividing.

FIG. 1 illustrates a plan view on a second main surface 100b of the encapsulation body 100 at which the semiconductor chips 10 may be exposed. Generally, the semiconductor chips 10 may be exposed and/or may be covered by encapsulating material 20 at one or both main surfaces of the encapsulation body 100. If the semiconductor chips 10 are not exposed at the second main surface 100b of the encapsulation body 100 but are covered by encapsulating material 20, FIG. 1 is to be interpreted to show the locations of the semiconductor chips 10, i.e. the chip outlines or "chip zones" rather than the "buried" semiconductor chips 10 as such.

Semiconductor device packages to be diced out of the encapsulation body 100 (and, e.g., additional layers covering the surfaces thereof) may comprise one or more semiconductor chips 10 and/or one or more parts of diced semiconductor chips 10. It is to be noted that the semiconductor chips 10 may be of different kind, shape, function, etc. As will be described further below in more detail, the semiconductor chips 10 may comprise, e.g., also semiconductor chips which may serve as an electrical contact between the first main surface and the second main surface 100b of the encapsulation body 100. One semiconductor device package may contain several semiconductor chips 10 of different kinds as described above.

Figure 2A:
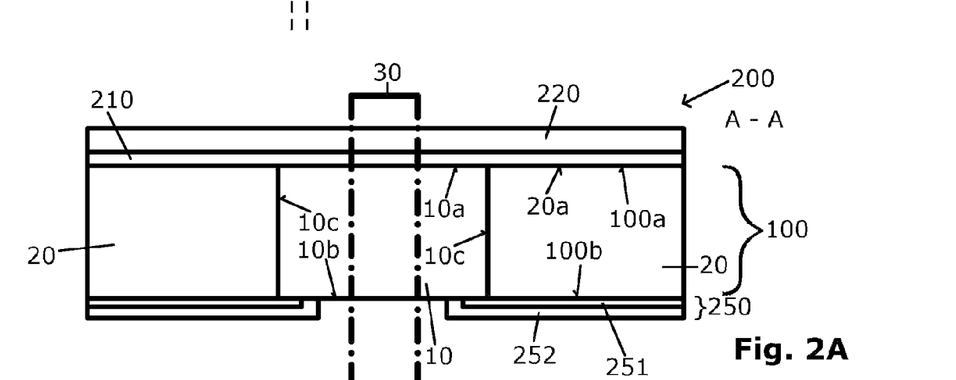
FIGS. 2A and 2B schematically illustrate a cross-sectional view along line A-A of FIG. 1 and a plan view, respectively, of a portion of an exemplary layer stack including an exemplary encapsulation body before laser ablation.

FIG. 2A illustrates a cross-sectional view of a layer stack 200 comprising an encapsulation body 100 across sectional line A-A of FIG. 1. The semiconductor chip 10 is embedded in the encapsulating material 20. The encapsulating material 20 extends over a part or the entire side walls 10c of the semiconductor chip 10. A first main surface 10a of the semiconductor chip 10 may be substantially coplanar with a first main surface 20a of the encapsulating material 20 to form a first main surface 100a of the encapsulation body 100 opposite to the second main surface 100b. In other embodiments the encapsulating material 20 may extend over the first main surface 10a of the semiconductor chips 10 to partly or entirely cover the semiconductor chips 10.

The semiconductor chip 10 may have a second main surface 10b opposite to the first main surface 10a. The second main surface 10b of the semiconductor chip 10 and a second main surface 20b of the encapsulating material 20 may, e.g., be substantially coplanar to form the second main surface 100b of the encapsulation body 100. In other embodiments the encapsulating material 20 may extend over the second main surface 10b of the semiconductor chip 10 to partly or entirely cover the semiconductor chip 10.

The semiconductor chip 10 may, e.g., be a semiconductor chip 10 having chip electrodes (not illustrated in FIG. 2A) at the second main surface 10b. The second main surface 10b of the semiconductor chip 10 may be an active surface of the semiconductor chip 10. In this case, the first main surface 10a is the backside of the semiconductor chip 10 and the second main surface 10b of the semiconductor chip 10 is the front side of the semiconductor chip 10. The semiconductor chip 10 may include e.g. an integrated circuit and/or other integrated components as mentioned above.

The semiconductor chip 10 may serve as an electrical through-connection for, e.g., shielding. In this case, the semiconductor chip 10 may include a low-ohmic semiconductor material such as, e.g., low-ohmic silicon. By way of example, the semiconductor chip 10 may be made of low-ohmic passive silicon having a resistance equal to or less than 1 mΩcm, 0.1 mΩcm, 0.01 mΩcm, or 1 μΩcm. The silicon may be selected from a group consisting of monocrystalline silicon, polycrystalline silicon and amorphous silicon. Alternatively or additionally the semiconductor chip 10 may include or be made of SiGe, GaAs, GaN, AlGaN, InGaAs, InAlAs, etc.

At least one of a metal layer 210 and an organic layer 220 are formed over the first main surface 100a of the encapsulation body 100. The metal layer 210 may be formed indirectly or directly on the first main surface 100a. The metal layer 210 may be formed over a part or the entire first main surface 100a of the encapsulation body 100. The metal layer 210 may extend over apart or the entire first surface 10a of the semiconductor chip 10. The metal layer 210 may extend over a part or the entire first main surface 20a of the encapsulating material 20.

The organic layer 220 may extend over a part or the entire first main surface 100a and, if present, over a part or the entire metal layer 210. The organic layer 220 may extend over a part or the entire first main surface 10a of the semiconductor chip 10 and/or over a part or the entire first main surface 20a of the encapsulating material 20.

The encapsulation body 100 is to be separated along the dicing street 30. As may be seen in FIG. 2A, organic material of the organic layer 220 and/or metal material of the metal layer 210 and e.g. semiconductor material of the semiconductor chip 10 has to be removed. According to various embodiments, at least one trace of the at least one of the metal layer 210 and the organic layer 220 is removed by laser ablation, and then, the encapsulation body 100 is separated along the at least one trace. Referring to FIG. 2A illustrating a portion of the encapsulation body 100 where the dicing street 30 intersects a semiconductor chip 10, separating the encapsulation body 100 comprises, e.g., separating the semiconductor chip 10.

In other words, generally, the encapsulation body 100 may contain a first zone comprising encapsulating material 20 and a second zone comprising semiconductor material of a semiconductor chip 10, wherein the at least one of the metal layer 210 and the organic layer 220 (if applied) may extend over the first zone and the second zone, and wherein the at least one trace may extend over the first zone and the second zone. A first zone of encapsulating material 20 and a second zone of semiconductor material may be arranged side-by-side in a lateral direction in the encapsulation body 100 (see e.g. FIG. 1). A first zone of encapsulating material 20 and a second zone of semiconductor material may also be arranged one over the other in a vertical direction (if the encapsulating material 20 covers at least one of the first or second main surfaces 10a, 10b of the semiconductor chip 10).

By way of example, the encapsulation body 100 may also be separated into a plurality of semiconductor device packages using dicing street 40. On using dicing street 40, similar to the process as described for dicing street 30, at least one trace of the at least one of the metal layer 210 and the organic layer 220 are removed by laser ablation. Then, the encapsulation body is separated along the at least one trace, wherein, for dicing street 40, it is the encapsulating material 20 which is to be separated.

The metal layer 210 may have a thickness equal to or greater or less than 0.5 μm, 2 μm, 5 μm, 8 μm, 10 μm, 15 μm, or 20 μm. In particular, a thickness in a range between 2 μm and 8 μm may be used.

The organic layer 220 may optionally be applied and may e.g. be electrically insulating. The organic layer 220, also referred to as a backside protection layer, may e.g. be an overmold layer or a laminate foil. The organic layer 220 may, e.g., comprise or be of one or more of the materials which have been disclosed above for the encapsulating material 20. The organic layer 220 may, however, be of a material different from the encapsulating material 20. E.g. an inorganic filler material different from a filler material included in the encapsulating material 20 may be used. The organic layer 220 may have a thickness equal to or greater or less than 10 μm, 20 μm, 30 μm, 40 μm, 50 μm. In particular, a thickness in a range between 20 μm and 40 μm may be used.

It is to be noted that the layer stack 200 may include one or more further layers extending over the first main surface 100a of the encapsulation body 100. By way of example, the layer stack 200 may e.g. include a first dielectric layer 1310 (see FIG. 13) extending between the organic layer 220 and the metal layer 210. Further, the layer stack 200 may e.g. include a second dielectric layer 1320 (see FIG. 13) extending between the metal layer 210 and the first main surface 100a of the encapsulation body 100. The (optional) first and second dielectric layers 1310, 1320 may each have a thickness equal to or greater or less than 2 μm, 7 μm, 10 μm, 12 μm or 15 μm. The dielectric layer (s) 1310, 1320 may comprise or be of polyimide, epoxy, acrylate, etc.

The semiconductor chip 10 may have a thickness (measured between the first main surface 10a and the second main surface 10b) of equal to or greater or less than 700 μm, 600 μm, 500 μm, 400 μm, 300 μm, 200 μm, 100 μm, or 50 μm. In particular, the thickness of the semiconductor chip 10 may be in a range between 200 μm and 500 μm.

The layer stack 200 may optionally include an electrical redistribution structure 250. The electrical redistribution structure may be applied over the second main surface 100b of the encapsulation body 100. The electrical redistribution structure 250 may e.g. include a multi-layer structure. The electrical redistribution structure 250 may e.g. include one or more metallization layers 251 and/or one or more dielectric (or insulating) layers 252.

The metallization layer 251 may include or be of a metal material such as, e.g., copper or aluminum. The metallization layer 251 may be configured for ground, current and/or signal redistribution. That is, chip electrodes (not shown in FIG. 2A) of the semiconductor chip 10 may be connected to conductive traces of the metallization layer 251. The conductive traces of the metallization layer 251 may, e.g., be configured to route to external terminals (e.g. solder deposits) of the semiconductor device package to be fabricated from the layer stack 200. Further, the conductive traces may be used as an internal interconnect. By way of example, if the semiconductor chip 10 is configured as an electrical through-connection, the semiconductor chip 10 (or, e.g. the part of the semiconductor chip 10 formed by dicing) may electrically connect the metal layer 210 to the metallization layer 251 and, in particular, to a conductive trace structured therein.

The dielectric (or insulating) layer 252 of the electrical redistribution structure 250 may include or be of a polymer material (e.g. polyimide, epoxy, silicon). The dielectric layer 252 may, e.g., be a solder-stop layer having openings (not shown) for solder deposits (not shown) to connect to the metallization layer 251. If a plurality of metallization layers 251 is included in the electrical redistribution structure 250, the metallization layers 251 may be separated from one another by dielectric (or insulating) layers 252. The metallization layer 251 may have a thickness of equal to or greater or less than 15 µm, 10 µm, 5 µm, 2 µm. The dielectric (or insulating) layer 252 may have a thickness of equal to or greater or less than 15 µm, 10 µm, 5 µm, 2 µm.

As illustrated in FIG. 2A, the electrical redistribution structure 250 may e.g. be structured to not extend over the second main surface 100b of the encapsulation body 100 in the kerf region, that is not to intersect with dicing streets 30, 40. In other words, the second main surface 100b of the encapsulation body 100 (including the second main surface 10b of the semiconductor chip 10 and/or the second main surface 20b of the encapsulating material) may be exposed in a region including the dicing streets 30, 40.

Figure 2B:
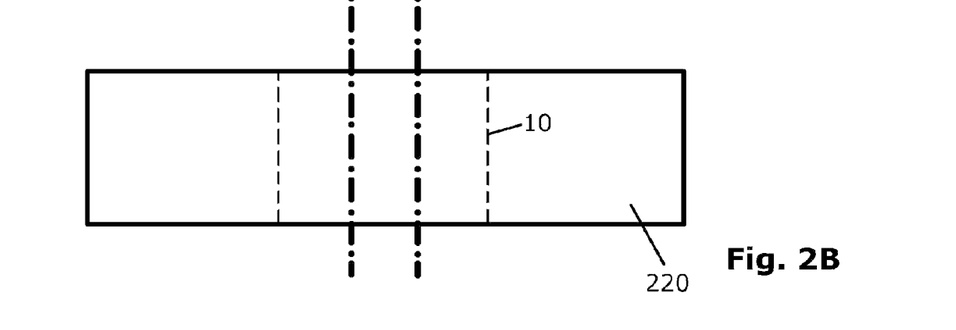

FIG. 2B illustrates a plan view on the upper surface of the layer stack 200 to be machined by laser ablation. The outline of the semiconductor chip 10 is indicated by a dashed line.

Figure 3A:
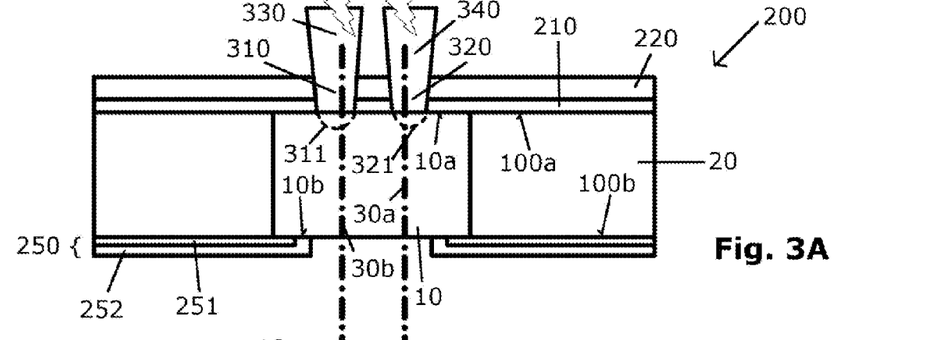
FIGS. 3A and 3B schematically illustrate a cross-sectional view and a plan view, respectively, of the portion of the layer stack of FIGS. 2A-B during laser ablation.

According to FIG. 3A, a plurality, e.g. two traces 310, 320, of the at least one organic layer 220 and/or the at least one metal layer 210 is removed by laser ablation. To that end, e.g. two (or more) laser beams 330, 340 may be directed simultaneously or subsequently onto the upper surface of the layer stack 200, i.e. in the direction of the first main surface 100a of the encapsulation body 100. The laser beams 330, 340 may each remove traces of the material over the first main surface 100a. This process of removing at least one trace of the metal layer 210 and/or the organic layer 220 is referred to as laser grooving or laser precut herein.

Lines 30a, 30b indicate the borderlines of the dicing street 30 as defined by the dicing operation to separate the encapsulation body 100, e.g. by mechanical sawing. The laser ablation may either remove material over the whole width of the dicing street 30 (see FIGS. 6A-B) or may remove material only at the regions at the two borderlines 30a, 30b of the dicing street 30, see FIGS. 3A-B. In the latter case, at least two traces 310, 320 of the material over the first main surface 100a are removed and at least one strip of material extending between the first and second traces 310, 320 may remain on the encapsulation body 100 of the layer stack 200. The at least two traces 310, 320 may be parallel. The at least two traces 310, 320 may e.g. be linear, i.e. straight lines.

Figure 3B:
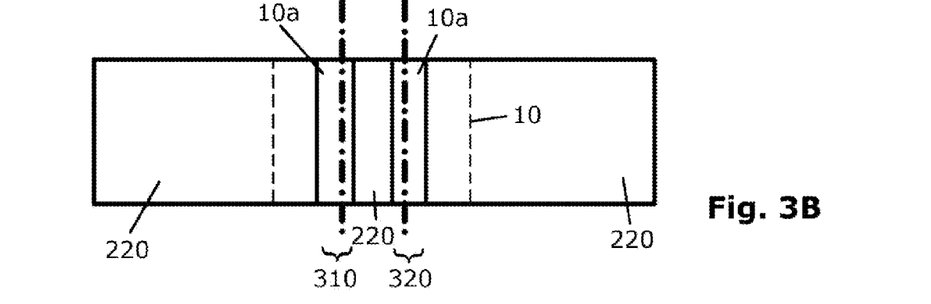

The laser beams 330, 340 do not separate the encapsulation body 100. More specifically, a laser beam 330, 340 incident on the upper surface 10a of the semiconductor chip 10 may not divide the semiconductor chip 10 and a laser beam 330, 340 incident on the upper surface 20a of the encapsulating material 20 may not divide the encapsulating material. Rather, depending on the intensities of the laser beams 330, 340 and other parameters, the laser beams 330, 340 may alter the microstructure and properties of the corresponding base material within the traces 310, 320 in a near surface region. By way of example, when incident on the first main surface 10a of the semiconductor chip 10, the laser beams 330, 340 may create amorphous regions 311, 321. Similarly, when incident on the first main surface 20a of the encapsulating material 20, the laser beams 330, 340 may create molten, re-solidified, e.g. oxidized and/or welded regions along the traces 310, 320. Such change of microstructure of abase material exposed to a laser beam is referred to as a heat-affected zone (HAZ).

The HAZs created by laser grooving may be beneficial for the subsequent encapsulation body 100 separation process, e.g. mechanical sawing. By way of example, HAZs of amorphous regions 311, 321 as e.g. created at the first main surface 10a of the semiconductor chip 10 may reduce chipping and/or crack propagation at semiconductor corners due to sawing pressure. Further, the creation of HAZs during the laser precut (laser grooving) can be identified by inspection of the semiconductor device package and may thus provide structural evidence of the performed laser grooving method.

Figure 4A:
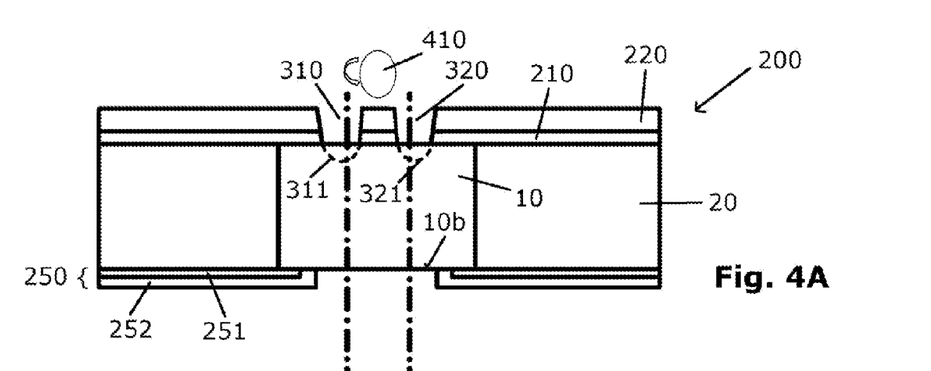
FIGS. 4A and 4B schematically illustrate a cross-sectional view and a plan view, respectively, of the portion of a layer stack of FIGS. 3A-B during dicing.
Figure 4B:
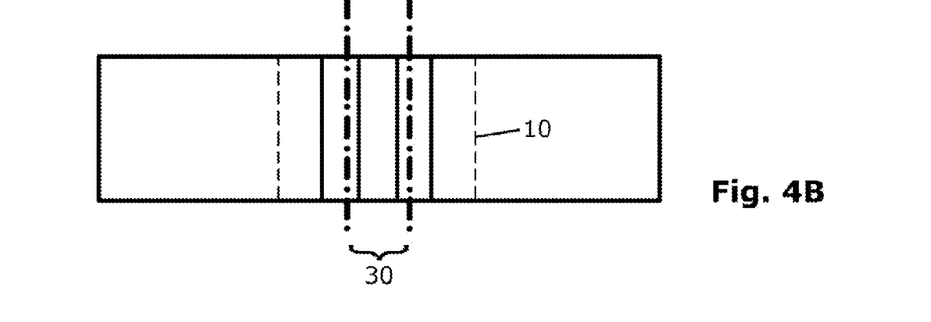

Referring to FIGS. 4A-B, after laser grooving, the encapsulation body 100 is divided, e.g. mechanically sawn. Borderlines 30a, 30b indicate the side walls of the dicing street 30. Dicing of the encapsulation body 100 may e.g. be performed by any mechanical sawing process. Reference numeral 410 indicates e.g. a sawing tool used for sawing. As shown in FIGS. 4A-B, the material strip (organic layer 220 and/or metal layer 210) between the traces 310, 320 is removed by the dicing process. Dicing (e.g. sawing) is performed either through the semiconductor chip 10 and through the encapsulating material 20 (see dicing street 30) or exclusively through the encapsulating material 20 (see dicing street 40). The multiple laser line (or laser trace) grooving process, as illustrated by way of example by FIGS. 3A-B and 4A-B, significantly reduces chipping during sawing, while there may still be some clogging of the diamond grains of the sawing tool 310 caused by the remaining strip of material between traces 310, 320.

Figure 5A:
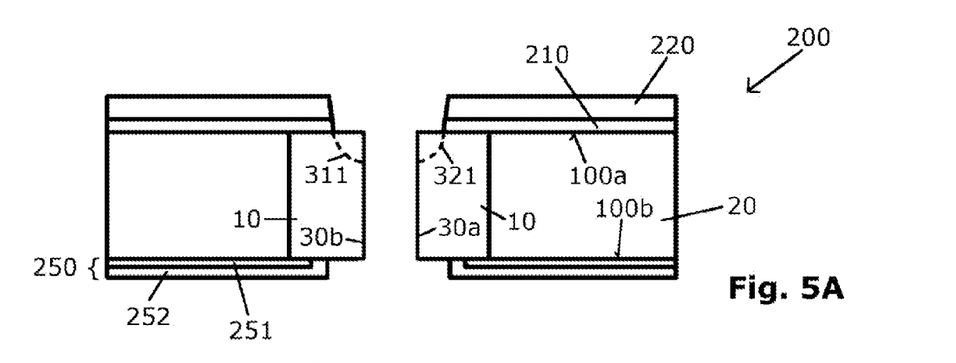
FIGS. 5A and 5B schematically illustrate a cross-sectional view and a plan view, respectively, of the portion of the layer stack of FIGS. 4A-B after dicing.
Figure 5B:
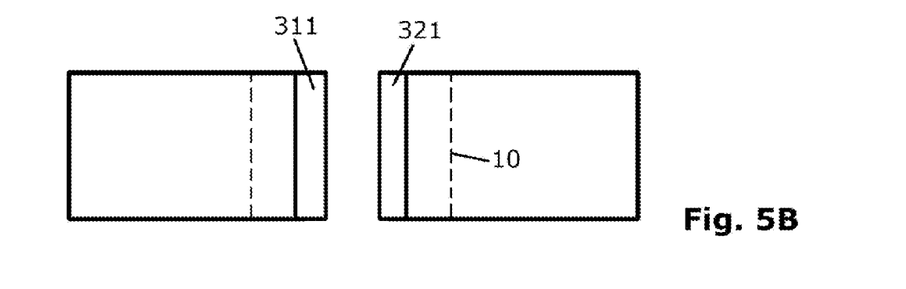

FIGS. 5A-B schematically illustrate a cross-sectional view and a plan view, respectively, of the portion of the layer stack 200 of FIGS. 4A-B after the encapsulation body 100 has been divided into a plurality of semiconductor device packages (i.e. embedded device packages) by, e.g., mechanical sawing. The layer stack 200 is completely separated along the dicing street 30. The material over the first surface 100a (e.g. the metal layer 210 and/or the organic layer 220) shows a slit-like opening which is greater in width than the width of the dicing street 30. The same applies for a dicing street 40 running exclusively through encapsulating material 20. Laser removal zones and e.g. overlapping HAZs 311, 321 may be exposed at corners of the first surface 10a/100a of the layer stack 200. The borderlines 30a, 30b of the dicing street 30 may define side walls of e.g. semiconductor material (section line A-A of FIG. 1) and/or of e.g. encapsulating material (section line B-B of FIG. 1) of the semiconductor device packages.

Figure 6A:
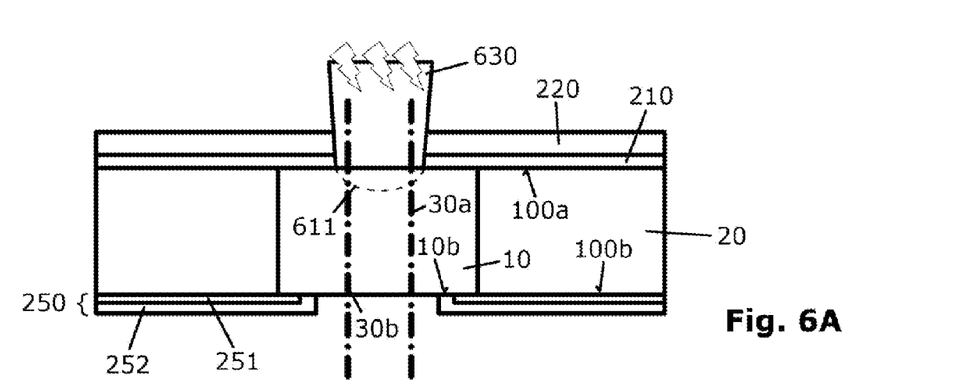
FIGS. 6A and 6B schematically illustrate a cross-sectional view and a plan view, respectively, of the portion of the layer stack of FIGS. 2A-B during laser ablation.
Figure 6B:
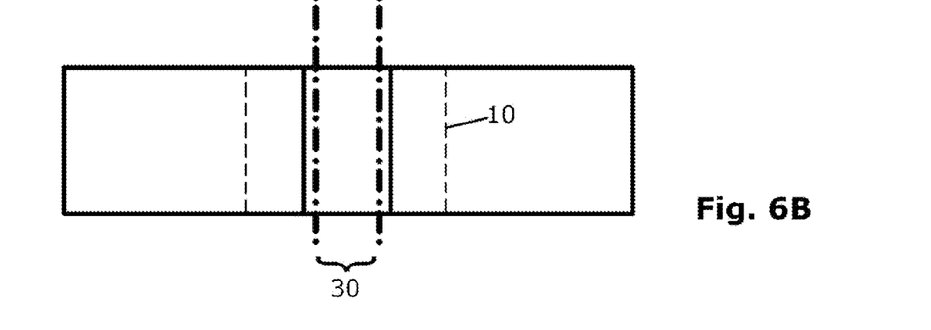

FIGS. 6A-B illustrate a similar process as explained in conjunction with FIGS. 3A-B except that the complete kerf area 30/40 is laser grooved or treated. Laser grooving may be performed, e.g., by one laser beam. 630 and by one or multiple laser beam passes instead of two passes of laser beams 330, 340. E.g. in case of a single laser beam pass, laser beam 630 may have a focal width which is greater than the width of the dicing street 30 as defined by the spacing between the borderlines 30a and 30b. Here, a HAZ 611 may be generated to completely cover the sawing street or kerf 30, 40. Again, as described previously, the laser grooving or laser precut process does not divide the encapsulation body 100 but removes traces of the layers over the first surface 100a of the encapsulation body 100.

Figure 7A:
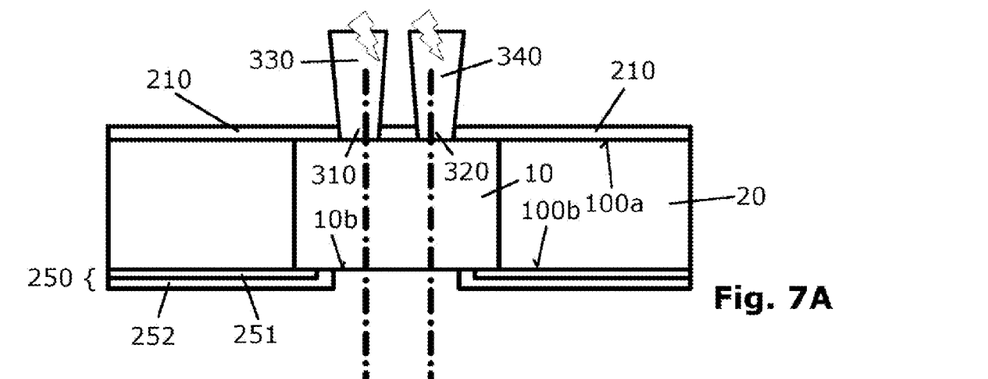
FIGS. 7A and 7B schematically illustrate a cross-sectional view and a plan view, respectively, of a portion of an exemplary layer stack including an exemplary encapsulation body during laser ablation.
Figure 7B:
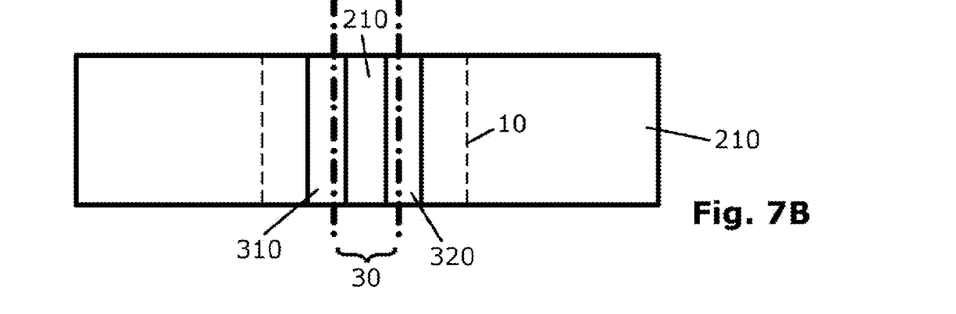
Figure 13:
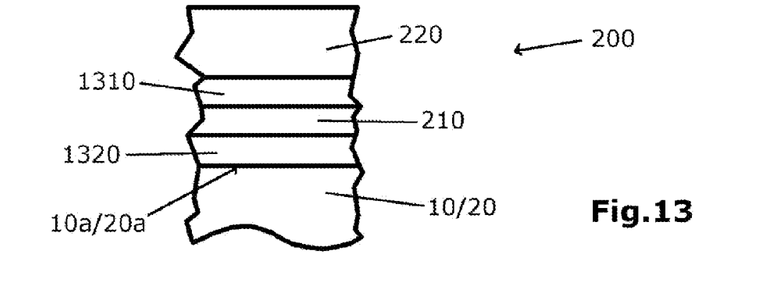
FIG. 13 schematically illustrates a cross-sectional view of a portion of an exemplary layer stack and/or semiconductor device package.

FIGS. 7A-B illustrate an exemplary embodiment of a method in accordance with the disclosure. FIGS. 7A-B are similar to FIG. 3A-B except that the material over the first surface 100a of the encapsulation body 100 does not include an organic (protection) layer 220 as described above. It may optionally include first and/or second dielectric layers 1310, 1320 as shown in FIG. 13 and it includes the metal layer 210. Byway of example, only the metal layer 210 may be provided over the first surface 100a of the encapsulation body 100.

By way of example, the laser beams 330, 340 may irradiate directly on the metal layer 210. Traces 310, 320 of the metal layer 210 may be removed. A two laser lines (laser traces) grooving method, as illustrated by way of example in FIGS. 7A-B, or a single laser line (laser trace) grooving method, as explained earlier in conjunction with FIGS. 6A-B, may be used.

After laser grooving the dicing streets 30 are cut to form side walls corresponding to the dicing street borderlines 30a, 30b. Again, except that no organic (protection) layer 220 is provided, a diced layer stack similar to diced layer stack 200 as illustrated in FIGS. 5A-B, however, without organic layer 220, is obtained.

Figure 8A:
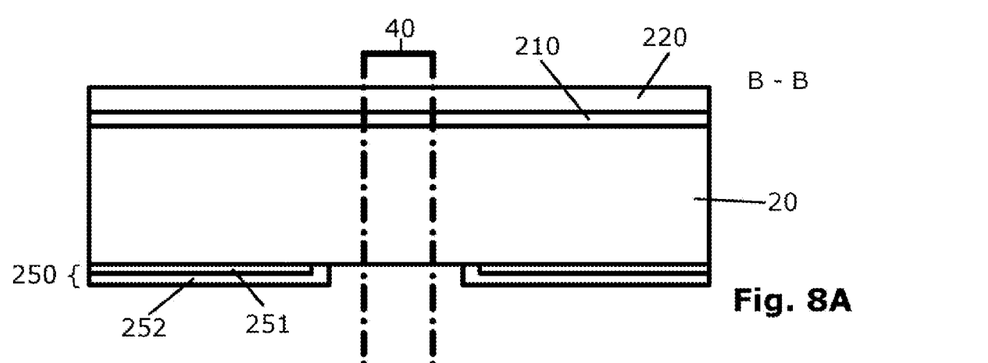
FIGS. 8A and 8B schematically illustrate a cross-sectional view along line B-B of FIG. 1 and a plan view, respectively, of a portion of an exemplary layer stack including an exemplary encapsulation body before laser ablation.
Figure 8B:
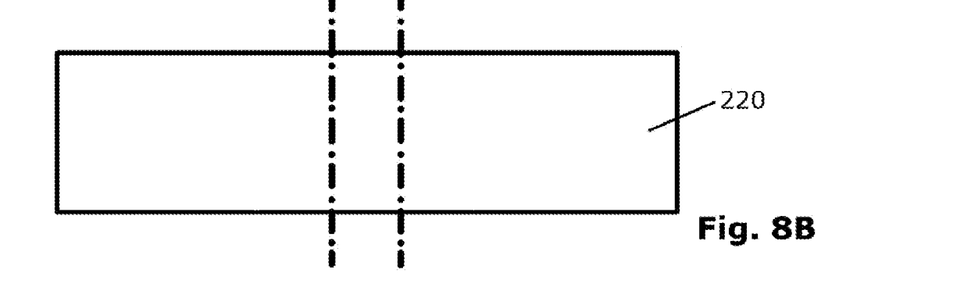

FIGS. 8A-B are illustrations similar to FIGS. 2A-B, however, for a dicing street 40 rather than a dicing street 30. FIGS. 8A-B may also apply for dicing street 30 if taken at section line B-B of FIG. 1.

Figure 9A:
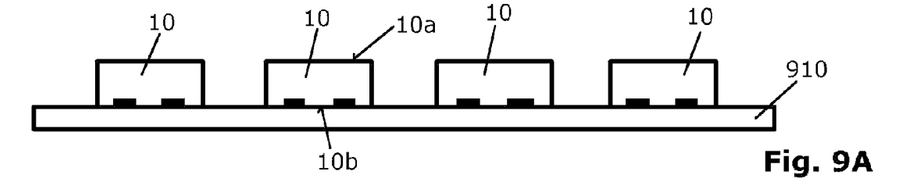
FIGS. 9A and 9B schematically illustrate an exemplary embodiment of a method to fabricate an encapsulation body comprising an array of semiconductor chips.
Figure 9B:
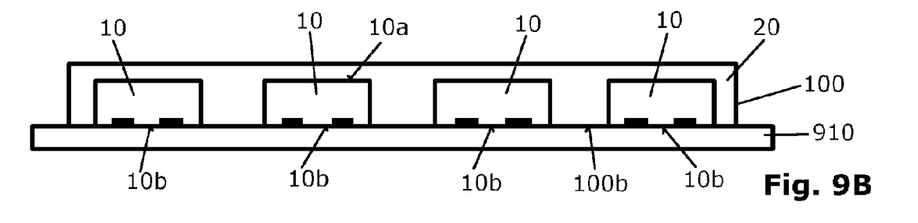

FIGS. 9A-B illustrate an exemplary method of forming an encapsulation body 100. A plurality of semiconductor chips 10, e.g. of same kind or of different kind, are placed in a spaced-apart relationship on a temporary carrier 910. The semiconductor chips 10 are secured to the temporary carrier 910 by the application of an adhesive, e.g. a sticky tape (not shown). In FIG. 9B the encapsulating material 20 is applied over the temporary carrier 910 and the semiconductor chips 10. The encapsulating material 20 may completely cover the semiconductor chips 10 except of their second surfaces 10b. In other embodiments the encapsulating material 20 may partly or completely expose the first surfaces 10a of the semiconductor chips 10.

The encapsulating material 20 may be a laminate material or a mold material. After hardening or curing, the encapsulating material 20 becomes rigid and provides stability to the embedded array of semiconductor chips 10, which is referred to as an encapsulation body 100 (or "artificial wafer" or "reconfigured wafer") herein. It may be defined by the upper surface of the temporary carrier 910. A small thickness of the encapsulation body 100 and/or a partial or complete exposure of the first surfaces 10a of the semiconductor chips 10 may be obtained by optional grinding or lapping of the encapsulation body 100 or by other methods. Generally, here and in all other embodiments the first surface 100a of the encapsulation body 100 may be partly or completely formed by encapsulating material 20 embedding the semiconductor chips 10 or the first surfaces 10a of the semiconductor chips 10 may be partly or completely exposed at the first surface 100a.

Figure 10A:
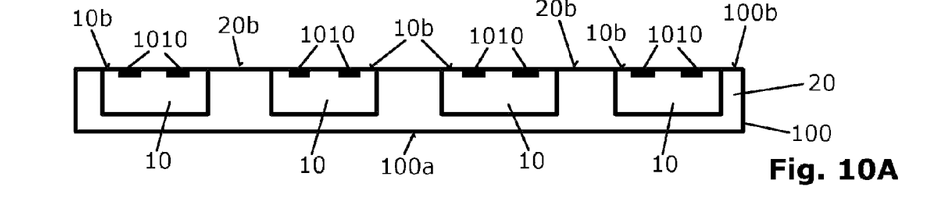
FIGS. 10A to 10C schematically illustrate one exemplary embodiment of a method to apply a metal layer and/or an organic layer as well as an electrical redistribution structure to the encapsulation body of FIGS. 9A-B.

In FIG. 10A the encapsulation body 100 is released from the temporary carrier 910. To this end, the adhesive or sticky tape (not shown) may feature e.g. thermo-release or UV release properties. The second surface 100b of the encapsulation body 100 may be plane, i.e. the second (e.g. active) surfaces 10b of the semiconductor chips 10 may lie flush with the second main surface 20b of the encapsulating material 20. Chip electrodes 1010, e.g. I/O electrodes, ground electrodes, power supply electrodes, load electrodes, control electrodes, etc., may be exposed at the second main surfaces 10b of the semiconductor chips 10.

Figure 10B:
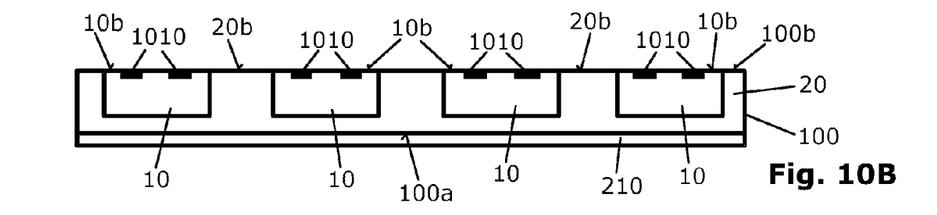

Referring to FIG. 10B, forming at least one of the metal layer 210 and the organic layer 220 over the first main surface 100a of the encapsulation body 100 is exemplified by the formation of the metal layer 210.

Figure 10C:
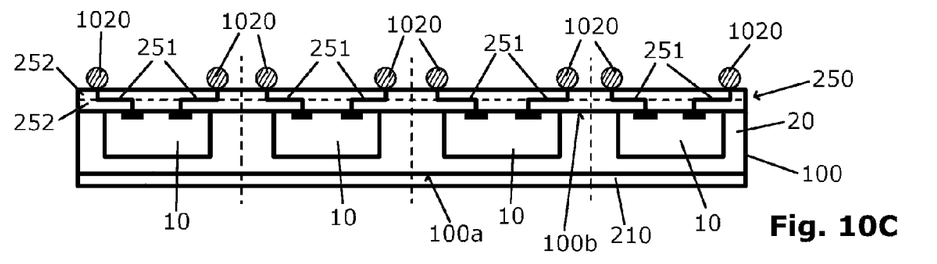

Referring to FIG. 10C, the electrical redistribution layer 250 may be formed over the common plane composed of e.g. the second main surfaces 10b of the semiconductor chips and the second main surface 20b of the encapsulating material 20. As exemplified above, the electrical redistribution structure 250 may include one or more metallization layers 251 and one or more dielectric (or insulating) layers 252. The uppermost of the dielectric (or insulating) layers 252 may serve as a solder stop when solder deposits 1020, e.g. solder balls, are optionally applied to exposed regions of the metallization layer 251.

The dielectric (or insulating) layer(s) 252 and the metallization layer(s) 251 may be manufactured in thin-film technology using photo-lithographic structuring techniques. Each of these structuring processes may e.g. be performed on the entire encapsulation body 100 (i.e. on "reconfigured wafer" level), e.g. by exposing the entire encapsulation body 100 by a global mask or reticle process rather than by exposing the single semiconductor chips 10 individually by a mask process in a sequential manner.

Figure 11A:
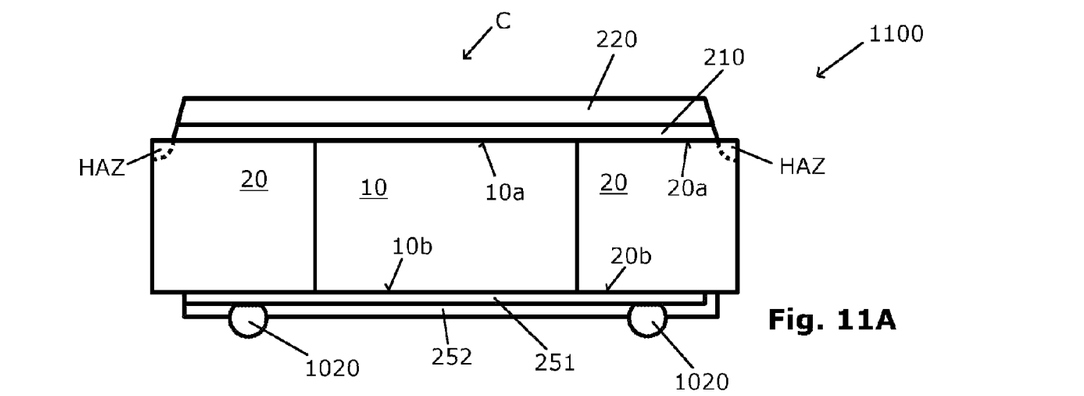
FIG. 11A schematically illustrates a cross-sectional view and Figure and 11B schematically illustrates a plan view from direction C of FIG. 11A of an exemplary semiconductor device package.
Figure 11B:
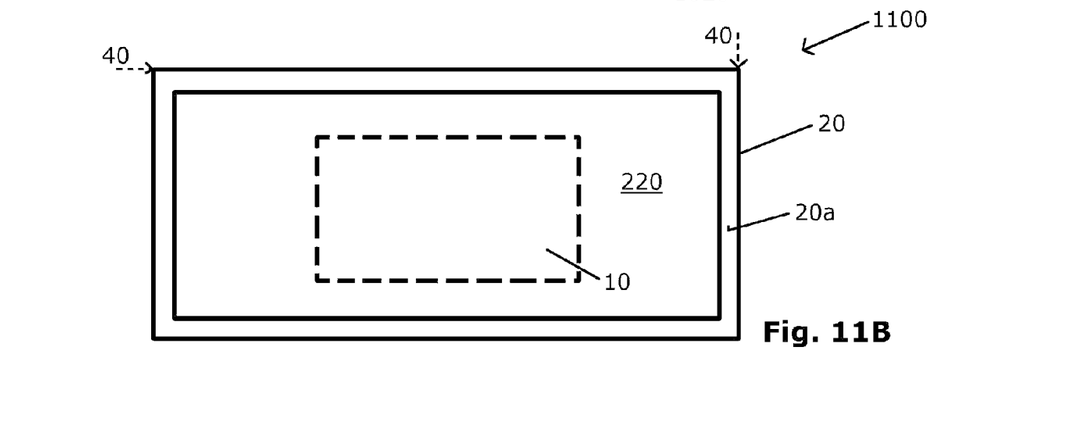

FIGS. 11A-B illustrate an exemplary semiconductor device package 1100. The semiconductor device package 1100 has been formed by the technique of dividing a layer stack 200 as described above. The semiconductor device package 1100 is an embedded device package. As may be seen from FIG. 11B, the semiconductor device package 1100 includes a semiconductor chip 10 which is, by way of example, to all sides surrounded by encapsulating material 20. In other words, semiconductor device package 1100 may be obtained by dividing a layer stack 200 as shown in FIGS. 2A-B along dicing streets 40 as shown in FIG. 1 of the corresponding encapsulation body 100. The semiconductor device package 1100 may also contain multiple semiconductor chips surrounded to all sides by encapsulating material 20.

Figure 12A:
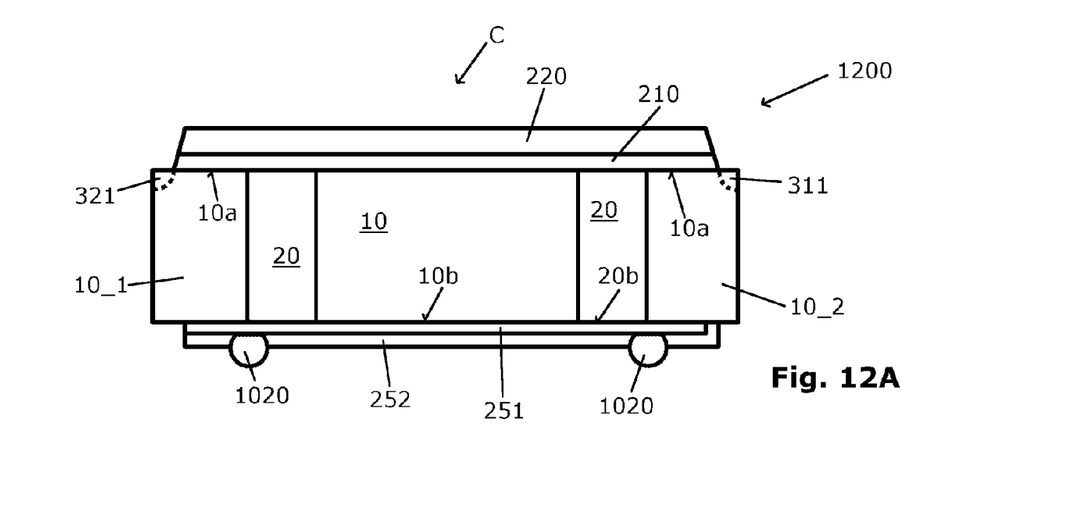
FIG. 12A schematically illustrates a cross-sectional view and FIG. 12B schematically illustrates a plan view from direction C of FIG. 12A of an exemplary semiconductor device package.
Figure 12B:
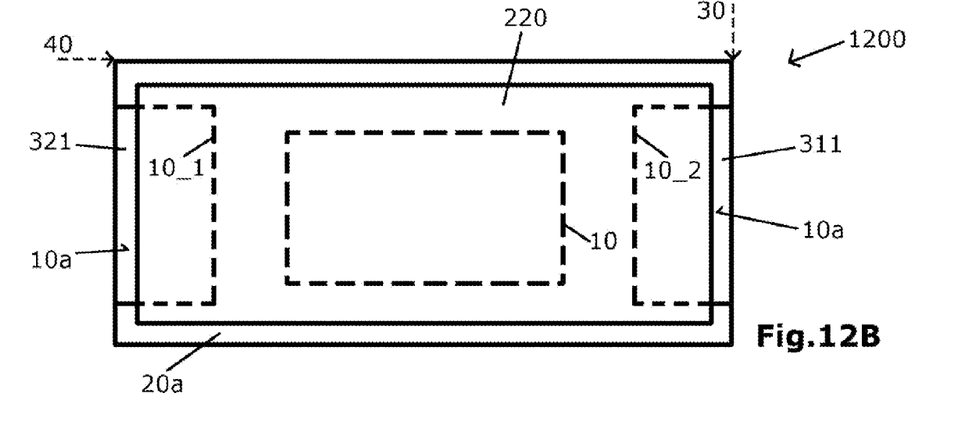

FIGS. 12A-B exemplify a semiconductor device package 1200. Semiconductor device package 1200 is an embedded chip package similar to embedded chip package 1100. However, semiconductor device package 1200 includes further semiconductor structures such as, e.g. two partial semiconductor chips 10_1 and 10_2. Partial semiconductor chips 10_1 and 10_2 may each be arranged at side walls of the semiconductor device package 1200. That is, partial semiconductor chip 10_1 and/or partial semiconductor chip 10_2 may be fabricated from a layer stack 200 by a dicing street 30 intersecting semiconductor chips 10. The semiconductor device package 1200 may contain additional semiconductor chip(s) of various or different kinds as described above. Further, the semiconductor device package 1200 may contain only one or more partial semiconductor chip(s) 10_1, 10_2 obtained by dicing.

Partial semiconductor chips 10_1, 10_2 may include or may not include an integrated circuit. Partial semiconductor chip 10_1 and/or partial semiconductor chip 10_2 may form an electrical contact or interconnect, which electrically couples the metal layer 210 at the backside (i.e. over the first surface 100a) of the encapsulation body 100 to the electrical redistribution structure 250. To that end, as mentioned earlier, the first partial semiconductor chip 10_1 and/or the second partial semiconductor chip 10_2 may include or be of low-ohmic semiconductor material, e.g. low-ohmic silicon or any material described above.

As shown in FIGS. 11A-B and 12A-B, at a corner region of the semiconductor device package 1100 and 1200, the first main surface 20a of the encapsulating material 20 of the package (also referred to as encapsulant herein) may be free of the at least one of a metal layer 210 and an organic layer 220. At the corner region, it may include a heat affected zone (HAZ). Further, at a corner region of the semiconductor device package 1200, the first main surface 10a of the first partial semiconductor chip 10_1 and/or the second partial semiconductor chip 10_2 may be free of the at least one of a metal layer 210 and an organic layer 220. At this corner region, it may include a heat affected zone (HAZ) 321 and 311, respectively.

Figure 14:
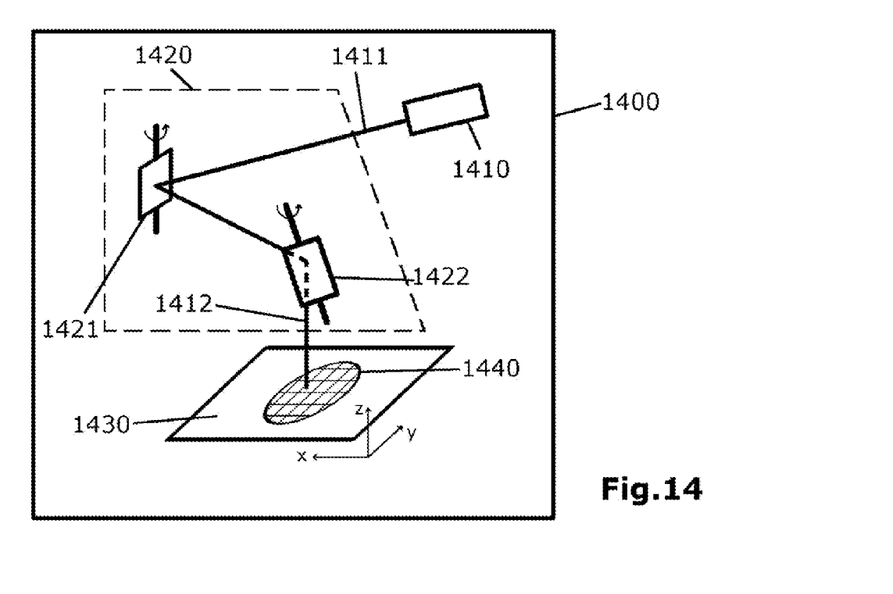
FIG. 14 schematically illustrates an exemplary embodiment of a method of laser machining a layer stack comprising an encapsulation body containing a plurality of semiconductor chips, whereby laser machining comprises laser marking and laser grooving.

FIG. 14 illustrates a laser marking station 1400. The laser marking station 1400 may comprise a laser 1410, a laser beam deflection optic 1420 and a table 1430, optionally an x-y-(z) alignment table 1430. A laser beam 1411 is emitted by the laser 1410 and directed to the laser beam deflection optic 1420. The laser beam deflection optic 1420 may be configured to controllably vary the direction and/or the focal length of a laser beam 1412 emitted by the laser beam deflection optic 1420. To that end, the laser beam deflection optic 1420 may comprise, e.g., a first mirror 1421, a second mirror 1422 and one or more lenses (not shown). The mirrors 1421, 1422 may be configured to be rotated by motor drives (not shown). That way, the laser beam 1412 emitted by the laser beam deflection optic 1420 may be controlled to hit at a desired and variably controlled location on a layer stack 1440 placed on the alignment table 1430 with main surface 100a of the encapsulation body 100 facing away from the table 1430. The laser beam deflection optic 1420 may comprise, by way of example, a so-called galvo head including at least two galvo motors and two galvo mirrors.

The table 1430 may be movable in a x-direction and in a y-direction defining a plane which is parallel to an upper surface of the layer stack 1440. The layer stack 1440 may be, e.g., any layer stack 200 as described herein.

The laser marking station 1400 is configured to label semiconductor device packages to be separated out of the layer stack 1440 by laser marking. Laser marking may comprise labeling the semiconductor device packages by scribing letters, characters, numbers, etc. into one of the material layers 210, 220 extending over the encapsulation body 100 or directly into the encapsulating material 20. Labeling each semiconductor device package may comprise engraving one or more of a manufacturer information, a fabrication data, factory identification data, batch data, etc. on the semiconductor device package. Labeling the semiconductor device packages is done before they are separated out of the layer stack 1440 (e.g. layer stack 200). Labeling may be done by operating the laser beam deflection optic 1420 in a suitable way to write down the information on the layer stack 1440.

The laser marking station 1400 may also be used for laser grooving as explained by way of examples above. More specifically, e.g. the same laser equipment, in particular the same laser 1410 which is used for laser marking may be used for laser grooving and may thus remove the traces 310, 320 of at least one of the metal layer 210 and/or the organic layer 220 covering the encapsulation body 100 (in particular a semiconductor chip 10) by laser ablation, wherein the trace 310, 320 corresponds to an encapsulation body 100 dicing line. In particular, the laser beam deflection optic 1420 may also be operated for laser grooving, i.e. for removing the traces 310, 320 of the at least one of a metal layer 210 and/or the organic layer 220 covering the encapsulation body 100. Further, the laser system 1400 with deflection optic 1420 may groove the complete dicing street 611, FIG. 6A, by e.g. multi-passing.

The x-y-(z) alignment table 1430 may be operated to move the layer stack 1440 (containing the encapsulation body 100) in the x-direction or in the y-direction for laser grooving, i.e. to draw the at least one trace 310, 320 across the layer stack 1440. The laser beam deflection optic 1420 may, during laser grooving, maintain the laser beam 1412 in a fixed direction. In other embodiments laser grooving may be performed by the laser beam deflection optic 1420 and, e.g., by "job sharing" operation of the x-y-(z) alignment table 1430. In this case, the laser beam deflection optic 1420 may be configured to move the laser beam 1412 over the upper surface of the layer stack 1440 during laser grooving.

It is to be noted that the laser parameters (e.g. pulse energy, pulse duration, spot size, energy density, power density etc.) may change from laser marking to laser grooving. In particular, it may be possible that laser marking is merely performed in the organic layer 220 of the layer stack, while laser grooving comprises removal of all material layers over the encapsulation body 100, that is, e.g., removal of the organic layer 220, the metal layer 210, and, e.g., dielectric layers 1310, 1320. Furthermore, the depth and/or width of the traces 310, 320 may be controlled and/or adjusted by multi-passing.

The advantages of such combination of processes (marking and grooving) are, e.g., a reduction of the number of equipment, a reduction of equipment passes and loading/unloading processes and a reduction of auxiliary process times (handling, pattern recognition).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device package, the method comprising:
   encapsulating at least partially a plurality of semiconductor chips with encapsulating material to form an encapsulation body, the encapsulation body having a first main surface and a second main surface;
   forming at least one of a metal layer and an organic layer over the first main surface of the encapsulation body;
   removing at least one trace of the at least one of the metal layer and the organic layer by laser ablation; and then
   separating the encapsulation body into a plurality of semiconductor device packages along the at least one trace by mechanical sawing, wherein the encapsulation body comprises a first zone comprising encapsulating material and a second zone comprising a semiconductor material of a semiconductor chip, wherein the at least one of the metal layer and the organic layer extends over the first zone and the second zone, and the at least one trace extends over the first zone and the second zone, wherein separating the encapsulation body cuts through encapsulating material of the first zone and cuts through semiconductor material of the second zone.

2. The method of claim 1, wherein the first zone and the second zone are arranged side-by-side in relation to the plate-like form.

3. The method of claim 1, wherein the first zone and the second zone are arranged one over the other in relation to the plate-like form.

4. The method of claim 1, further comprising:
   forming a first dielectric layer extending over the at least one of the metal layer and the organic layer prior to laser ablation.

5. The method of claim 1, further comprising:
   forming a second dielectric layer extending over the first main surface of the encapsulation body and beneath the at least one of the metal layer and the organic layer prior to laser ablation.

6. The method of claim 1, further comprising:
removing at least two parallel traces of the at least one of the metal layer and the organic layer by laser ablation, wherein the encapsulation body is separated along the at least two parallel traces.

7. The method of claim 1, further comprising:
labeling the semiconductor device package by laser marking in the same laser work station used for the laser ablation,
wherein the labeling comprises scribing at least one of letters, characters and numbers into at least one of the metal layer and the organic layer.

8. The method of claim 7, wherein the laser marking is performed prior to separating the encapsulation body.

9. The method of claim 1, further comprising:
forming an electrical redistribution structure over the second main surface of the encapsulation body.

10. The method of claim 9, further comprising:
dividing the electrical redistribution structure when separating the encapsulation body along the at least one trace.

11. The method of claim 1, wherein the semiconductor chips have chip electrodes facing away from the first main surface.

12. A method of laser machining a layer stack comprising an encapsulation body containing a plurality of semiconductor chips, the method comprising:
labeling semiconductor device packages to be separated out of the layer stack by laser marking, wherein the laser marking comprises scribing at least one of letters, characters and numbers into at least one of a metal layer and an organic layer; and
removing at least one trace of at least one of a metal layer and an organic layer covering the encapsulation body by laser ablation, wherein the at least one trace corresponds to an encapsulation body separation line for semiconductor device package separation,
wherein the laser marking and the laser ablation for semiconductor device package separation are performed by using the same laser equipment.

13. A method of manufacturing a semiconductor device package, the method comprising:
encapsulating at least partially a plurality of semiconductor chips with encapsulating material to form an encapsulation body, the encapsulation body having a plate-like form with a first main surface and a second main surface;
forming a metal layer over the first main surface of the encapsulation body;
forming an electrical redistribution structure over the second main surface of the encapsulation body, wherein chip electrodes of the semiconductor chips face the electrical redistribution structure and are electrically connected to the electrical redistribution structure;
removing at least one trace of the metal layer by laser ablation; and
separating the encapsulation body into a plurality of semiconductor device packages along the at least one trace by removing at least one of the encapsulating material and a semiconductor material of the semiconductor chip after the removing at least one trace of the metal layer.

14. The method of claim 13, wherein the encapsulation body is separated by mechanical sawing.

* * * * *